United States Patent
Noh et al.

(10) Patent No.: US 10,777,772 B2
(45) Date of Patent: Sep. 15, 2020

(54) PANEL, TRANSISTOR AND ELECTRONIC DEVICE

(71) Applicant: LG Display Co., Ltd., Seoul (KR)

(72) Inventors: Jiyong Noh, Paju-si (KR); PilSang Yun, Paju-si (KR); SeHee Park, Paju-si (KR); JungSeok Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/668,262

(22) Filed: Oct. 30, 2019

(65) Prior Publication Data

US 2020/0152913 A1     May 14, 2020

(30) Foreign Application Priority Data

Nov. 12, 2018   (KR) ........................ 10-2018-0138409

(51) Int. Cl.
    *H01L 51/52*       (2006.01)
    *H01L 27/12*       (2006.01)
    *H01L 27/32*       (2006.01)

(52) U.S. Cl.
    CPC ...... *H01L 51/5256* (2013.01); *H01L 27/1222* (2013.01); *H01L 27/1237* (2013.01); *H01L 51/5253* (2013.01); *H01L 51/5259* (2013.01); *H01L 27/1214* (2013.01); *H01L 27/3244* (2013.01); *H01L 51/5237* (2013.01)

(58) Field of Classification Search
None
See application file for complete search history.

(56) References Cited

U.S. PATENT DOCUMENTS

| | | | | |
|---|---|---|---|---|
| 9,472,650 | B2 * | 10/2016 | Koo | .................. H01L 29/66757 |
| 2016/0087241 | A1 * | 3/2016 | Kim | .................... H01L 51/5253 |
| | | | | 257/40 |

* cited by examiner

*Primary Examiner* — Minh Loan Tran
(74) *Attorney, Agent, or Firm* — Morgan, Lewis & Bockius LLP

(57) ABSTRACT

A panel comprises a substrate, a semiconductor layer on the substrate, and including an oxide semiconductor or a low-temperature polycrystalline silicon, an interlayer insulating film on the substrate and the semiconductor layer, a passivation layer on the interlayer insulating film, an overcoat layer on the passivation layer, a light emitting layer on the overcoat layer, and an encapsulation layer on the light emitting layer. The encapsulation layer includes an auxiliary encapsulation layer having at least one of a silicon nitride (SiNx:H) layer including hydrogen, a silicon oxide ($SiO_2$:H) layer including hydrogen, or a silicon oxynitride (SiON:H) layer including hydrogen. At least one of the interlayer insulating film, the passivation layer, or the overcoat layer is a hydrogen trapping layer.

11 Claims, 12 Drawing Sheets

PANEL, TRANSISTOR AND ELECTRONIC DEVICE

CROSS-REFERENCE TO RELATED APPLICATION

This application claims the priority benefit of Korean Patent Application No. 10-2018-0138409, filed on Nov. 12, 2018, in the Korean Intellectual Property Office, the disclosure of which is incorporated herein by reference in its entirety.

BACKGROUND

Field of the Disclosure

The present disclosure relates to panels, transistors and electronic devices.

Description of the Background

As the information society has developed at a rapid rate, there is an increasing need for electronic devices, such as display devices, lighting devices, or the like employing advanced technologies and more efficient methods. Such electronic devices can include a panel having transistors and the like for driving pixels, and a driving circuit for driving the panel.

Some electronic devices include components that are susceptible to moisture and oxygen. For example, organic light emitting diodes (OLED) include a light emitting layer formed from an organic material that may be susceptible to moisture and oxygen.

Accordingly, the light emitting layer of the organic light emitting diode (OLED) may be encapsulated using an encapsulation layer in order to prevent penetration of moisture and oxygen from the ambient environment.

However, a physical property of a semiconductor layer included in the transistor may be changed due to hydrogen contained in the electronic device. Therefore, there is a need for preventing adverse effects of the hydrogen in electronic devices.

SUMMARY

Accordingly, the present disclosure is directed to a panel, a transistor and an electronic device that substantially obviate one or more problems due to limitations and disadvantages of the prior art.

It is at least one object of the present disclosure to provide a panel, a transistor and an electronic device for preventing a semiconductor layer from being changed by hydrogen contained in the electronic device by including a hydrogen trapping layer capable of trapping hydrogen.

It is at least one object of the present disclosure to provide a panel, a transistor and an electronic device which comprise a hydrogen trapping layer with an improved hydrogen trapping capability.

Additional features and advantages of the disclosure will be set forth in the description which follows and in part will be apparent from the description, or may be learned by practice of the disclosure. The objectives and other advantages of the disclosure will be realized and attained by the structure particularly pointed out in the written description and claims hereof as well as the appended drawings.

In accordance with one aspect of the present disclosure, a panel comprises a substrate; a semiconductor layer on the substrate, and including an oxide semiconductor or a low-temperature polycrystalline silicon; an interlayer insulating film on the substrate and the semiconductor layer; a passivation layer on the interlayer insulating film; an overcoat layer on the passivation layer; a light emitting layer on the overcoat layer; and an encapsulation layer on the light emitting layer, wherein the encapsulation layer includes an auxiliary encapsulation layer having at least one of a silicon nitride ($SiN_x$:H) layer including hydrogen, a silicon oxide ($SiO_2$:H) layer including hydrogen, or a silicon oxynitride (SiON:H) layer including hydrogen, wherein at least one of the interlayer insulating film, the passivation layer, or the overcoat layer is a hydrogen trapping layer, wherein the hydrogen trapping layer includes a first layer having silicon nitride ($SiN_x$), a second layer having a different composition from the first layer and contacting one surface of the first layer, and a third layer having a greater thickness than each of the first and second layers, and wherein a ratio A:B of a thickness 'A' of the first layer to an entire thickness 'B' of the hydrogen trapping layer is 1:2000 to 1:20, and a ratio C:B of a thickness 'C' of the second layer to the entire thickness 'B' of the hydrogen trapping layer is 1:2000 to 1:20.

In accordance with another aspect, a transistor on a substrate comprises a semiconductor layer on the substrate, and including an oxide semiconductor or a low-temperature polycrystalline silicon; a gate insulating layer on the semiconductor layer; a gate electrode on the gate insulating layer; an interlayer insulating film on the gate electrode and the semiconductor layer; a source electrode electrically connected to the semiconductor layer in an upper portion of one end of the semiconductor layer; a drain electrode electrically connected to the semiconductor layer in an upper portion of the other end of the semiconductor layer; and a passivation layer on the source electrode, the drain electrode, and the interlayer insulating film, wherein at least one of the interlayer insulating film or the passivation layer is a hydrogen trapping layer, wherein the hydrogen trapping layer includes a first layer having silicon nitride ($SiN_x$), a second layer having a different composition from the first layer and contacting one surface of the first layer, and a third layer having a greater thickness than each of the first and second layers, wherein a ratio A:B of a thickness 'A' of the first layer to an entire thickness 'B' of the hydrogen trapping layer is 1:2000 to 1:20, and a ratio C:B of a thickness 'C' of the second layer to the entire thickness 'B' of the hydrogen trapping layer is 1:2000 to 1:20.

In accordance with another aspect, a display panel comprises a substrate; a semiconductor layer on the substrate; an interlayer insulating film on the substrate and the semiconductor layer; a passivation layer on the interlayer insulating; an overcoat layer on the passivation layer; a light emitting layer on the overcoat layer; and an encapsulation layer on the light emitting layer, wherein the encapsulation layer includes at least one of a silicon nitride ($SiN_x$:H) layer including hydrogen, a silicon oxide ($SiO_2$:H) layer including hydrogen, or a silicon oxynitride (SiON:H) layer including hydrogen, wherein at least one of the interlayer insulating film, the passivation layer, or the overcoat layer includes a first layer having silicon nitride ($SiN_x$), a second layer having a different composition from the first layer and contacting the first layer, and a third layer having a greater thickness than each of the first and second layers.

In accordance with embodiments of the present disclosure, it may be possible to provide a panel, a transistor and an electronic device for preventing a semiconductor layer from being changed by hydrogen contained in the electronic device by including a hydrogen trapping layer capable of trapping hydrogen.

In accordance with embodiments of the present disclosure, it may be possible to provide a panel, a transistor and an electronic device which include a hydrogen trapping layer with an improved hydrogen trapping capability.

In accordance with embodiments of the present disclosure, it may be possible to provide a panel, a transistor and an electronic device which is capable of preventing a characteristic of a threshold voltage Vth in an electronic component from being reduced due to the degradation of a semiconductor layer caused by hydrogen by including a hydrogen trapping layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
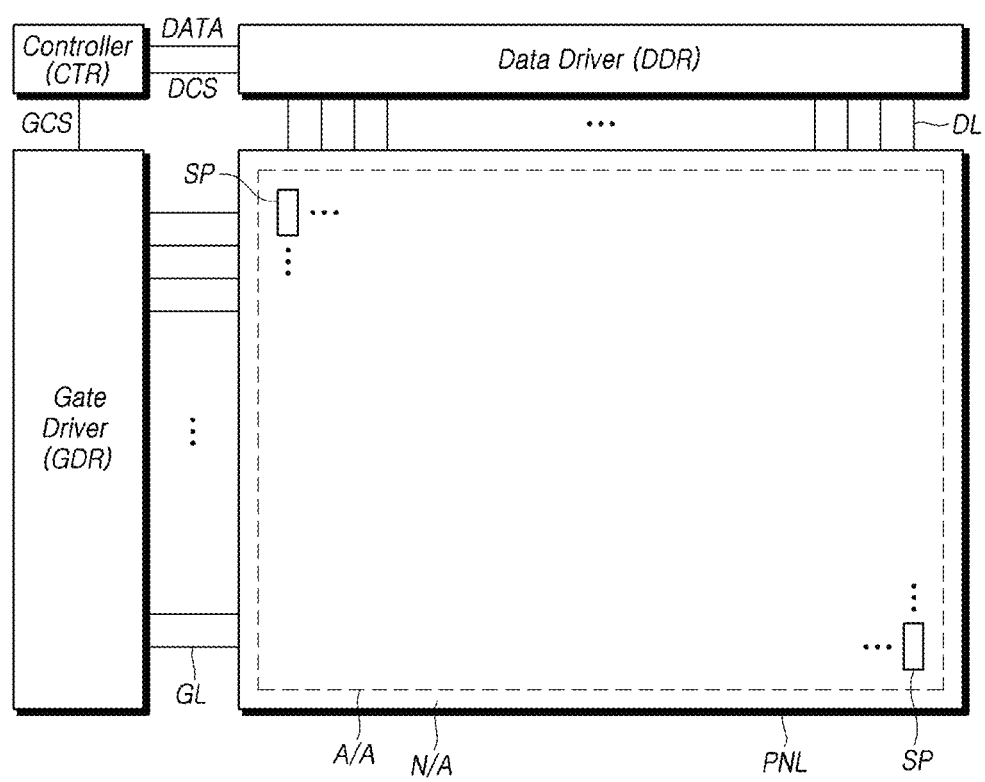
FIG. 1 is a diagram schematically illustrating a system configuration of an electronic device according to embodiments of the present disclosure.

Reference will now be made in detail to embodiments of the present disclosure, examples of which are illustrated in the accompanying drawings.

In the following description of examples or embodiments, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of the present disclosure, detailed descriptions of well-known functions and components incorporated herein will be omitted when it is determined that the description may make the subject matter in some embodiments of the present disclosure rather unclear.

Terms, such as 'first," "second," 'A,' 'B,' '(A),' or '(B)' may be used herein to describe elements of the disclosure. Each of these terms is not used to define essence, order, sequence, or number of elements etc., but is used merely to distinguish the corresponding element from other elements. When it is mentioned that a first element "is connected or coupled to," "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element.

FIG. 1 is a diagram schematically illustrating a system configuration of an electronic device according to embodiments of the present disclosure.

The display device according to embodiments of the present disclosure may comprise a display device, a lighting device, a light emitting device, or the like. Hereinafter, for convenience of description and ease of understanding, although embodiments of the present disclosure are described and illustrated in terms of a display device, it should be understood that embodiments herein are not limited thereto, but are additionally applicable to various electronic devices, such as a lighting device, a light emitting device, or the like.

In accordance with embodiments of the present disclosure, the electronic device may comprise a panel PNL for displaying images or outputting light, and a driving circuit (or a driver) for driving the panel PNL.

The panel PNL may comprise a plurality of data lines DL and a plurality of gate lines GL, and a plurality of subpixels SP may be arranged in areas defined by the plurality of data lines DL and the plurality of gate lines GL in a matrix.

The plurality of data lines DL and the plurality of gate lines GL may be arranged such that the data lines DL and the gate lines GL intersect each other in the panel PNL. For example, the plurality of gate lines GL may be arranged in rows or columns, and the plurality of data lines DL may be arranged in the columns or the rows. Hereinafter, for convenience of description and ease of understanding, it may be assumed that the plurality of gate lines GL is arranged in the rows and the plurality of data lines DL is arranged in the columns.

In addition to the plurality of gate lines GL and the plurality of data lines DL, the panel PNL may further comprise other types of signal lines depending on a structure of a subpixel, or the like. For example, the display panel may further comprise at least one driving voltage line, at least one reference voltage line, at least one common voltage line, or the like.

The panel (PNL) may be one of various types of panels, such as a liquid crystal display (LCD) panel, an organic light emitting diode (OLED) panel, or the like.

Types of signal lines arranged in the display panel D-PNL may differ depending on a subpixel structure, a panel type (an LCD panel, an OLED panel, etc.), or the like. Herein, the signal line may include an electrode to which a signal is applied.

The panel PNL may comprise an active area A/A in which an image is displayed, and a non-active area N/A in which an image is not displayed and which is peripheral area of the active area A/A. Herein, the non-active area N/A may sometimes be referred to as a bezel area or an edge of the panel or the display device.

A plurality of subpixel (SP) is arranged in the active area A/A for displaying images.

Conductive pads to which a data driver DDR is electrically connected may be arranged in the non-active area N/A, and a plurality of data link lines may be arranged to connect between the conductive pads and the plurality of data lines DL. The conductive pads may be formed from an array or other arrangement of conductive traces or patches. The plurality of data link lines may be either parts of the plurality of data lines DL extending to the non-active area N/A, or separate patterns electrically connected to the plurality of data lines DL.

Further, gate-driving-related lines may be arranged in the non-active area N/A for delivering a voltage (signal) needed for driving a gate of at least one transistor included in at least one subpixel to a gate driver GDR through the conductive pads to which the data driver DDR is electrically connected. For example, the gate-driving-related lines may comprise a clock line for delivering clock signals, a gate voltage line for delivering gate voltages VGH and VGL, a gate driving control signal line for delivering various control signals needed for generating scan signals, or the like. The gate-driving-related lines are arranged in the non-active area N/A, unlike the gate lines GL arranged in the active area A/A.

The driving circuit may comprise the data driver DDR for driving the plurality of data lines DL, the gate driver GDR for driving the plurality of gate lines GL, and a controller CTR for controlling the display driver DDR and the gate driver GDR.

The data driver DDR may drive the plurality of data lines DL by providing data voltages to the plurality of data lines DL.

The gate driver GDR may drive the plurality of gate lines GL by providing scan signals to the plurality of gate lines GL.

The controller CTR may control driving operations of the data driver DDR and the gate driver GDR by providing various control signals DCS and GCS needed for driving the data driver DDR and the gate driver GDR. Furthermore, the controller CTR may supply image data DATA to the data driver DDR.

The controller CTR enables a scan of subpixels to be initiated according to a timing processed in each frame. The controller CTR converts image data inputted from other devices or image-providing sources to a data signal form used in the data driver DDR, outputs image data DATA obtained from the converting to the data driver DDR, and enables data lines to be updated during the scan of the subpixels.

In order to control the data driver (DDR) and the gate driver (GDR), the controller (CTR) receives a timing signal, such as a vertical synchronous signal (Vsync), a horizontal synchronous signal (Hsync), an input data enable (DE) signal, a clock signal (CLK), or the like, from other devices or image-providing sources, such as a host system, and generates various control signals and outputs the generated signals to the data driver (DDR) and the gate driver (GDR).

For example, to control the gate driver GDR, the controller CTR outputs various gate control signals GCS including a gate start pulse GSP, a gate shift clock GSC, a gate output enable signal GOE, or the like.

In addition, to control data driver DDR, the controller CTR outputs various data control signals DCS including a source start pulse SSP, a source sampling clock SSC, a source output enable signal SOE, or the like.

The controller may be a timing controller used in typical display technology, or a control apparatus/device capable of additionally performing other control functionalities in addition to the typical function of the timing controller.

The controller CTR may be implemented either as a separate component from the data driver DDR, or as an integrated circuit by being integrated with the data driver DDR.

The data driver DDR drives a plurality of data lines DL by providing data voltages to the plurality of data lines DL after having received image data DATA from the controller CTR. Herein, the data driver DDR may sometimes be referred to as a source driver.

The data driver DDR may transmit various signals to and/or receive them from the controller CTR through various interfaces.

Furthermore, the gate driver GDR sequentially drives a plurality of gate lines GL by sequentially providing scan signals to the plurality of gate lines GL. Herein, the gate driver GDR may sometimes be referred to as a scan driver.

According to the control of the controller CTR, the gate driver circuit GDR sequentially provides scan signals with a turn-on voltage level or a turn-off voltage level to the plurality of gate lines GL.

When a specific gate line is asserted by a scan signal from the gate driver GDR, the data driver DDR converts image data DATA received from the controller CTR into analog data voltages and provides the obtained analog data voltages to the plurality of data lines DL.

The data driver DDR may be located on, but not limited to, only one side (e.g., an upper side or a lower side) of the panel PNL, or in some embodiments, be located on, but not limited to, two sides (e.g., the upper side and the lower side) of the panel PNL depending on a driving scheme, a panel design scheme, or the like.

Similarly, the gate driver GDR may be located on, but not limited to, only one side (e.g., a left side or a right side) of the panel PNL, or in some embodiments, be located on, but not limited to, two sides (e.g., the left side and the right side) of the panel PNL depending on a driving scheme, a panel design scheme, or the like.

The data driver DDR may be implemented by including one or more source driver integrated circuits SDIC. Each source driver integrated circuit SDIC may comprise a shift register, a latch circuit, a digital to analog converter DAC, an output buffer, or the like. In some embodiments, the data driver DDR may further include one or more analog to digital converters ADC.

Each source driver integrated circuit SDIC may be connected to at least one pad, such as a bonding pad, of the panel PNL in a tape automated bonding (TAB) type or a chip on glass (COG) type, or be directly disposed on the panel PNL. In some embodiments, each source driver integrated circuit SDIC may be integrated and disposed on the panel PNL. In addition, each source driver integrated circuit SDIC may be implemented in a chip on film (COF) type. In this instance, each source driver integrated circuit SDIC may be mounted on a circuit film and electrically connected to the data lines DL arranged in the panel PNL through the circuit film.

The gate driver GDR may comprise a plurality of gate driving circuits GDC. Each of the plurality of gate driving circuits GDC may correspond to one or more of the plurality of gate lines.

Each gate driving circuit GDC may comprise a shift register, a level shifter, and the like.

Each gate driving circuit GDC may be connected to at least one pad, such as a bonding pad, of the panel (PNL) in a tape automated bonding (TAB) type or a chip on glass (COG) type. Here, the bonding pad may be formed from a conductive trace or patch. Further, each gate driving circuit GDC may be implemented in a chip on film (COF) type. In this instance, each gate driving circuit GDC may be mounted on a circuit film and electrically connected to the gate lines GL arranged in the panel PNL through the circuit film. Each gate driving circuit GDC may be integrated into the panel PNL by being implemented in a gate in panel (GIP) type. That is, each gate driving circuit GDC may be directly formed in the panel PNL.

Figure 2:
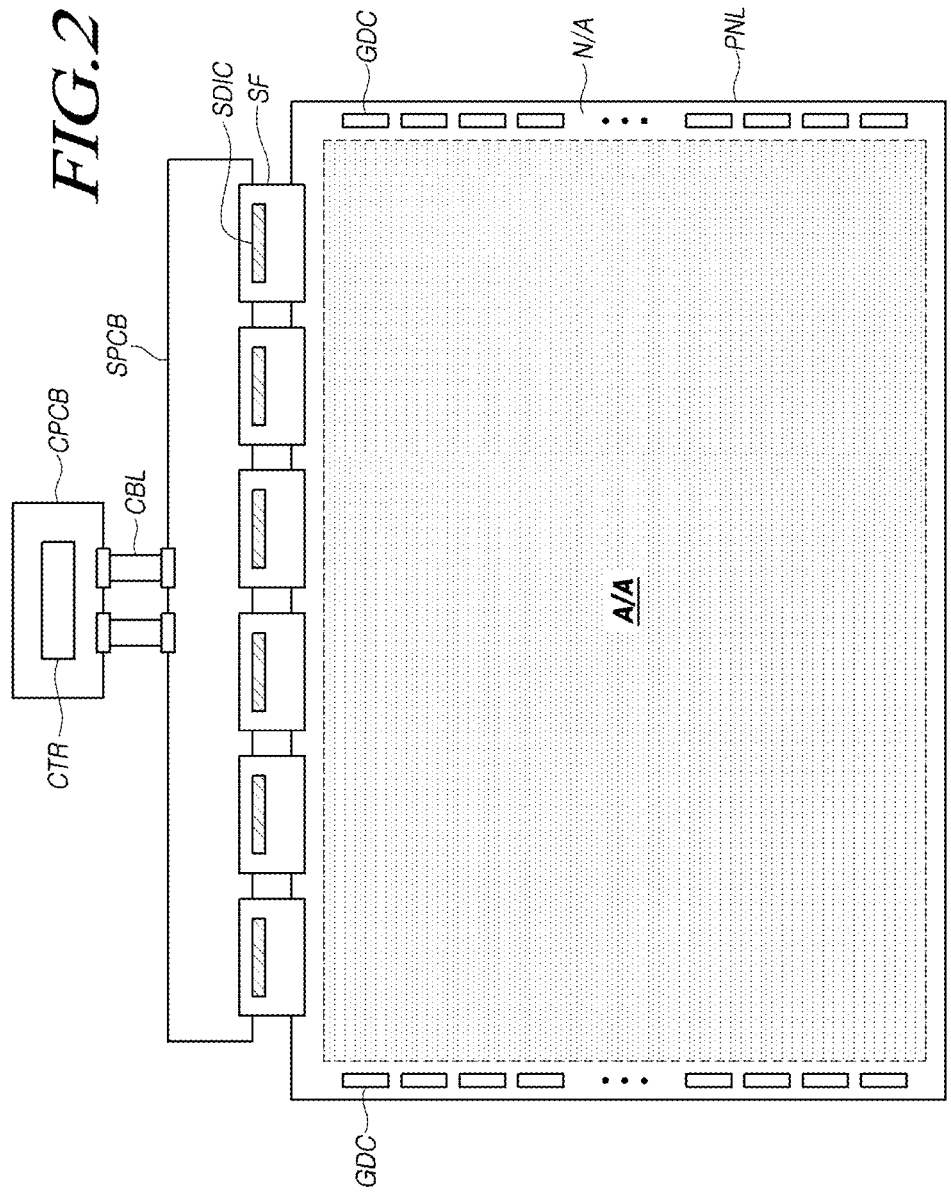
FIG. 2 is a diagram illustrating a system implementation of the electronic device according to embodiments of the present disclosure.

FIG. 2 is a diagram illustrating a system implementation of the electronic device according to embodiments of the present disclosure.

With reference to FIG. 2, in the display device according to embodiments of the present disclosure, the data driver DDR may be implemented in the chip on film (COF) type of various types, such as the TAB, the COG, the COF, the GIP, or the like. Also, the driver GDR may be implemented in the gate in panel (GIP) type of various types, such as the TAB, the COG, the COF, the GIP, or the like.

The data driver DDR may be implemented as one or more source driver integrated circuits SDIC. FIG. 2 illustrates an example of the data driver DDR implemented as a plurality of source driving integrated circuits SDIC.

When the data driver DDR is implemented in the COF type, each source driving integrated circuit SDIC performing the function of the data driver DDR may be mounted on a source side circuit film SF. The conductive pads arranged in the non-active area N/A of the panel PNL may be electrically connected to one side of the source side circuit film SF.

One or more lines electrically connecting between the source driving integrated circuit SDIC and the panel PNL may be arranged on the source side circuit film SF.

For circuit connections between the plurality of source driving integrated circuits SDIC and other units or electronic elements, the electronic device may comprise at least one source printed circuit board SPCB, and a control printed circuit board CPCB for mounting control units or components, and other electric components, units, or devices.

The other side of the source side circuit film SF in which the source driving integrated circuit SDIC is mounted may be connected to the at least one source printed circuit board SPCB.

That is, the one side and the other side of the source side circuit film SF in which the source driving integrated circuit SDIC is mounted may be electrically connected to the non-active area N/A of the panel PNL and the source printed circuit board SPCB, respectively.

The controller CTR for controlling the data driver DDR, the gate driver GDR, or the like may be disposed on the control printed circuit board CPCB.

Further, a power management integrated circuit PMIC that provides various voltages or currents, or controls various voltages or currents to be provided to the panel PNL, the data driver DDR, the gate driver GDR, and the like, may be disposed on the control printed circuit board CPCB.

The source printed circuit board SPCB and the control printed circuit board CPCB may be connected to each other for enabling an electric current to travel through at least one connector CBL. Here, the connector CBL may be a flexible printed circuit FPC, a flexible flat cable, or the like.

The at least one source printed circuit board SPCB and the control printed circuit board CPCB may be integrated into one printed circuit board.

When the gate driver GDR is implemented in the gate in panel (GIP) type, the plurality of gate driving circuits GDC included in the gate driver GDR may be directly formed in the non-active area N/A of the panel PNL. Each of the plurality of gate driving circuits GDC may output a scan signal corresponding to a gate line arranged in the active area A/A of the panel PNL.

The plurality of gate driving circuits GDC arranged in the panel PNL may receive various signals (a clock signal, a high level gate voltage (VGH), a low level gate voltage (VGL), a start signal (VST), a reset signal (RST), or the like) needed for generating the scan signal through gate-driving-related lines arranged in the non-active area N/A.

The gate-driving-related lines arranged in the non-active area N/A may be electrically connected to the source side circuit film SF disposed closest to the plurality of gate driving circuits GDC.

Figure 3:
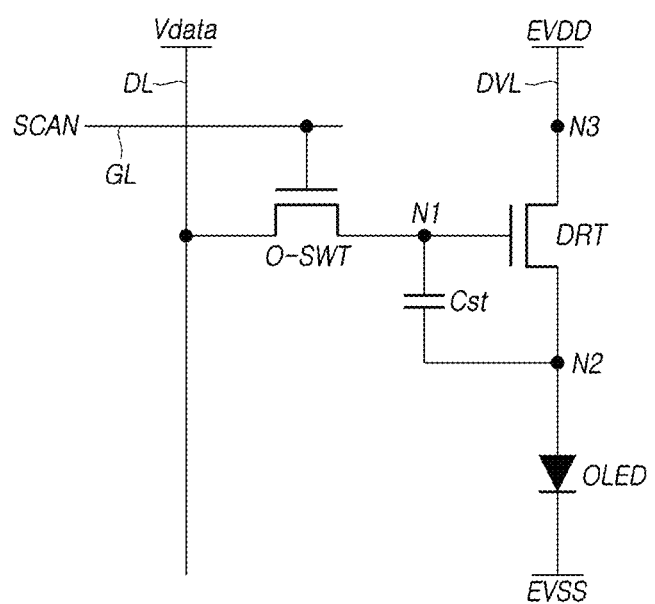
FIG. 3 is a diagram illustrating a structure of a subpixel in the case of an organic light emitting diode (OLED) panel according to embodiments of the present disclosure.

FIG. 3 is a diagram illustrating a structure of a subpixel in the case of an organic light emitting diode (OLED) panel according to embodiments of the present disclosure.

With reference to FIG. 3, each subpixel SP in the panel 110 that is the OLED panel may comprise, but is not limited to, an organic light emitting diode (OLED), a driving transistor DRT for driving the organic light emitting diode (OLED), a switching transistor O-SWT electrically connected between a first node N1 of the driving transistor DRT and a corresponding data line DL, a storage capacitor Cst electrically connected between the first node N1 and a second node N2 of the driving transistor DRT, or the like.

The organic light emitting diode (OLED) may comprise an anode electrode, an organic light emitting layer and a cathode electrode, or the like. With reference to FIG. 3, the anode electrode (also referred to as a pixel electrode) of the organic light emitting diode (OLED) may be electrically connected to a second node N2 of the driving transistor DRT. A low power supply voltage EVSS may be applied to the cathode electrode (also referred to as a common electrode) of the organic light emitting diode (OLED).

Herein, the low power supply voltage EVSS may be a ground voltage or a voltage higher or lower than the ground voltage. A level of the low power supply voltage EVSS may vary depending on driving states. For example, a level of the low power supply voltage EVSS when image driving is performed may be differently set from a level of the low power supply voltage EVSS when sensing driving is performed.

The driving transistor DRT enables the organic light emitting diode (OLED) to be driven by providing a driving current to the organic light emitting diode (OLED). The driving transistor DRT may comprise a first node N1, and a second node N2, and a third node N3.

The first node N1 of the driving transistor DRT may be the gate node thereof, and may be electrically connected to the source node or the drain node of the switching transistor O-SWT. The second N2 of the driving transistor DRT may be the source node or the drain node thereof, and may be electrically connected to the anode electrode (or the cathode electrode) of the organic light emitting diode (OLED). The third node N3 of the driving transistor DRT may be the drain node or the source node thereof. A driving power supply voltage EVDD may be applied to the third node N3 that may be electrically connected to a driving voltage line DVL supplying the driving power supply voltage EVDD.

The storage capacitor Cst may be electrically connected between the first node N1 and the second node N2 of the driving transistor DRT, and maintain a data voltage Vdata corresponding to an image signal voltage or a corresponding voltage thereto for one frame time (or a pre-configured time).

The drain node or the source node of the switching transistor O-SWT is electrically connected to a corresponding data line DL, and the source node or the drain node of the switching transistor O-SWT is electrically connected to the first node N1 of the driving transistor DRT. The gate node of the switching transistor O-SWT is electrically connected to a corresponding gate line, and may receive a scan signal SCAN.

On-off operation of the switching transistor O-SWT may be controlled by the scan signal SCAN input to the gate node of the switching transistor (O-SWT) through the gate line. The switching transistor O-SWT may be turned on by the scan signal SCAN, and transfer a data voltage Vdata provided from the data line DL to the first node N1 of the driving transistor DRT.

The storage capacitor Cst may be an external capacitor configured to be located outside of the driving transistor DRT and is other than an internal capacitor, that is, other than a parasitic capacitance (e.g., a Cgs, a Cgd) that is present between the first node N1 and the second node N2 of the driving transistor DRT.

Each of the driving transistor DRT and the switching transistor O-SWT may be an n-type transistor or a p-type transistor.

It should be understood that the subpixel structure with two transistors (2T) and one capacitor (1C) in FIG. 3 is merely one example of possible subpixel structures for convenience of discussion, and embodiments of the present disclosure may be implemented in any of various structures, as desired. For example, the subpixel may further include at least one transistor and/or at least one capacitor. In some embodiments, a plurality of subpixels may have an identical structure, or at least one of the plurality of subpixels may have a different structure from the others.

Figure 4:
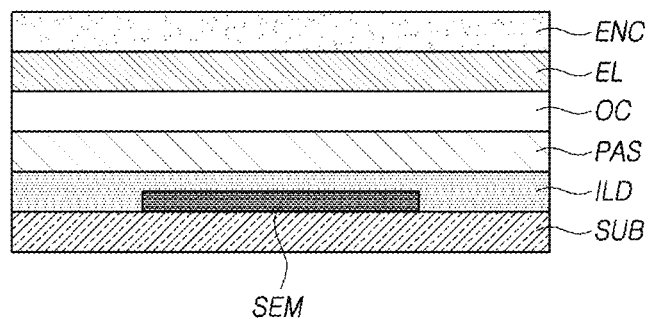
FIG. 4 is a cross-sectional view illustrating the panel according to embodiments of the present disclosure.

FIG. 4 is a cross-sectional view illustrating the panel according to embodiments of the present disclosure.

With reference to FIG. 4, the panel according to embodiments of the present disclosure may comprise a substrate SUB, a semiconductor layer SEM located on the substrate SUB, an interlayer insulating film ILD located on the substrate SUB and the semiconductor layer SEM, a passivation layer PAS located on the interlayer insulating film ILD, an overcoat layer OC located on the passivation layer PAS, a light emitting layer EL located on the overcoat layer OC and an encapsulation layer ENC located on the light emitting layer EL.

The semiconductor layer may comprise an oxide semiconductor or low temperature polycrystalline silicon. The oxide semiconductor may be an n-type oxide semiconductor comprising indium gallium zinc oxide (IGZO), indium zinc oxide (IZO), indium tin zinc oxide (ITZO), or the like, or a p-type semiconductor layer comprising CuOx, SnOx, NiOx, or the like. The low temperature polycrystalline silicon may refer to polycrystalline silicon synthesized at relatively low temperatures.

The oxide semiconductor and the low temperature polycrystalline silicon may have an advantage of excellent electron mobility characteristic, but may have a disadvantage in that their physical properties are vulnerable to hydrogen. However, in accordance with embodiments of the present disclosure, such deficiencies and other problems may be overcome or eliminated by preventing the physical property of the semiconductor layer from being reduced using a hydrogen trapping layer described in detail below.

The interlayer insulating film ILD may be disposed on the substrate SUB and the semiconductor layer SEM, and the passivation layer PAS may be disposed on the interlayer insulating film ILD. The overcoat layer OC may be disposed on the passivation layer PAS.

The light emitting layer EL may be disposed on the overcoat layer OC. The light emitting layer EL may be an organic light emitting layer including an organic material layer. A physical property of the organic material layer included in the light emitting layer EL may be reduced due to oxygen and moisture. It may be possible to prevent the light emitting layer EL from exposure to oxygen and moisture by disposing the encapsulation layer ENC on the light emitting layer EL.

The encapsulation layer ENC may comprise at least one auxiliary encapsulation layer, such as a silicon nitride (SiNx:H) layer including hydrogen, a silicon oxide ($SiO_2$:H) layer including hydrogen, and a silicon oxynitride (SiON:H) layer including hydrogen.

The encapsulation layer ENC may be formed after the light emitting layer EL, which includes an organic material weak to heat, has been formed. Because the encapsulation layer ENC is formed after the light emitting layer EL weak to heat has been formed, the auxiliary encapsulation layer included in the encapsulation layer ENC may be needed to be formed by plasma enhanced chemical vapor deposition (PECVD) that is performed at a relatively low temperature. However, when the auxiliary encapsulation layer is formed by performing the PECVD at a relatively low temperature, there is a possibility that a large amount of hydrogen may be included in the auxiliary encapsulation layer.

The hydrogen included in the auxiliary encapsulation layer may act as a cause of reducing characteristics of the semiconductor layer SEM, and in particular, when the semiconductor layer includes the oxide semiconductor or the low temperature polycrystline silicon, may cause characteristics of threshold voltages Vth of electronic components to be degraded.

In order to overcome the degradation of characteristics of electronic components due to hydrogen described above, at least one of the interlayer insulating film ILD, the passivation layer PAS and the overcoat layer OC may be the hydrogen trapping layer.

When the at least one of the interlayer insulating film ILD, the passivation layer PAS and the overcoat layer OC is the hydrogen trapping layer, it may be possible to prevent the characteristic of the semiconductor layer SEM from being degraded due to hydrogen included in the encapsulation layer ENC reaching the semiconductor layer SEM.

The hydrogen trapping layer may comprise a first layer including silicon nitride (SiNx). Furthermore, the hydrogen trapping layer may comprise a second layer having a composition different from that of the first layer and contacting one surface of the first layer.

The first layer and the second layer included in the hydrogen trapping layer may be formed using a thin film deposition process capable of controlling thin film deposition, such as metal-organic chemical vapor deposition (MOCVD), atomic layer deposition (ALD), or the like.

Here, the metal-organic chemical vapor deposition (MOCVD) is a type of chemical vapor deposition (CVD) in which, by enabling a raw material gas injected onto a high temperature substrate to lead to a decomposition reaction on the surface of the substrate, a thin film may be formed on the substrate. The metal-organic chemical vapor deposition (MOCVD) refers to a case where an organic metal complex is included in the raw material gas, and is a technique for growing a semiconductor thin film by pyrolyzing an organic metal gas on a heated substrate. When MOCVD is used, it may be possible to perform at a lower temperature than CVD using a halide gas, and to obtain a uniform film, since controlling a thin film at the atomic order is available.

Atomic layer deposition (ALD) may be a deposition method in which particles formed by a chemical reaction between reaction gases by separating and supplying reaction materials are deposited to form a thin film on a substrate surface. That is, the atomic layer deposition (ALD) may be a deposition method in which after one reaction material has been adsorbed chemically on a substrate, an additionally injected second or third gas is further adsorbed chemically on the adsorbed substrate, and as a result, a thin film may be deposited on the substrate.

When MOCVD or ALD is used, thin film productivity may be low and growth rate may be slow in comparison with a typical physical vapor deposition (PVD) and other chemical vapor deposition (CVD), but because excellent thin film deposition may be provided, it may be possible to adjust finely a thickness of the thin film. That is, when MOCVD or ALD is used, it may be possible to form a thin film with an excellent step coverage characteristic.

Further, MOCVD or ALD may be available to obtain excellent thickness uniformity and composition uniformity, and form a thin film with high density when forming a film or layer using an identical material, in comparison with typical methods, such as sputtering, the PECVD, or the like.

As described above, because the first layer is formed using MOCVD or ALD, the first layer may have higher density and lower thickness non-uniformity than the auxiliary encapsulation layer formed by the PECVD at a low temperature.

For example, when the auxiliary encapsulation layer including SiNx is formed using PECVD, the density of a resulted thin film may be 2.7 g/cm3 or less, and the thickness non-uniformity thereof may be 10% or more. On the contrary, when the first layer HCL1 including SiNx is formed using MOCVD or ALD, the density of a resulting thin film may be 2.83 g/cm3 or more, and the thickness non-uniformity thereof may be 3% or less.

As described above, because the second layer is formed using MOCVD or ALD, the second layer may have higher density and lower thickness non-uniformity than the auxiliary encapsulation layer formed by PECVD at a low temperature.

The second layer may comprise silicon oxide ($SiO_2$). When the second layer comprises the silicon oxide ($SiO_2$), the ability of the first layer included in the hydrogen trapping layer to trap hydrogen on an interface may be improved.

For example, when the auxiliary encapsulation layer including SiNx is formed using PECVD, the density of a resulting thin film may be 2.1 g/cm3 or less, and the thickness non-uniformity thereof may be 10% or more. On the contrary, when the second layer HCL2 including SiNx is formed using MOCVD or ALD, the density of a resulting thin film may be 2.27 g/cm3 or more, and the thickness non-uniformity thereof may be 3% or less.

The hydrogen trapping layer HCL may comprise a third layer HCL3 with a larger thickness than each of the first layer HCL1 and the second layer HCL2. The third layer HCL3 may not be a film formed using MOCVD or ALD. Instead, the third layer may be a layer formed by PECVD or sputtering, taking into account a process speed. Therefore, the third layer may be thicker than either the first layer HCL1 or the second layer HCL2 formed by MOCVD or ALD.

A ratio (A:B) of the thickness (A) of the first layer HCL1 to the entire thickness (B) of the hydrogen trapping layer may be 1:2000 to 1:20. This is because the hydrogen trapping layer HCL includes the third layer HCL3, which is not formed by MOCVD or ALD, and which therefore has a greater thickness compared with the first layer HCL1.

The first layer HCL1 may have higher density than the third layer HLT3, and the first layer HCL1 may have lower thickness non-uniformity than the third layer HCL3. As described above, this is because the third layer HCL3 is not formed by MOCVD or ALD, while the first layer HCL1 is formed by MOCVD or ALD.

A ratio (C:B) of the thickness (C) of the second layer HCL2 to the entire thickness (B) of the hydrogen trapping layer may be 1:2000 to 1:20. This is because the hydrogen trapping layer HCL includes the third layer HCL3, which is not formed by MOCVD or ALD, and which therefore has a greater thickness compared with the second layer HCL2.

The second layer HCL2 may have higher density than the third layer HLT3, and the second layer HCL2 may have lower thickness non-uniformity than the third layer HCL3. As described above, this is because the third layer HCL3 is not formed by MOCVD or ALD, while the second layer HCL2 is formed by MOCVD or ALD.

Because the hydrogen trapping layer HCL comprises the first layer HCL1 and the second layer HCL2 formed by MOCVD or ALD as described above, it may be possible for the hydrogen trapping layer HCL to have an excellent hydrogen trapping capability.

Figure 5:
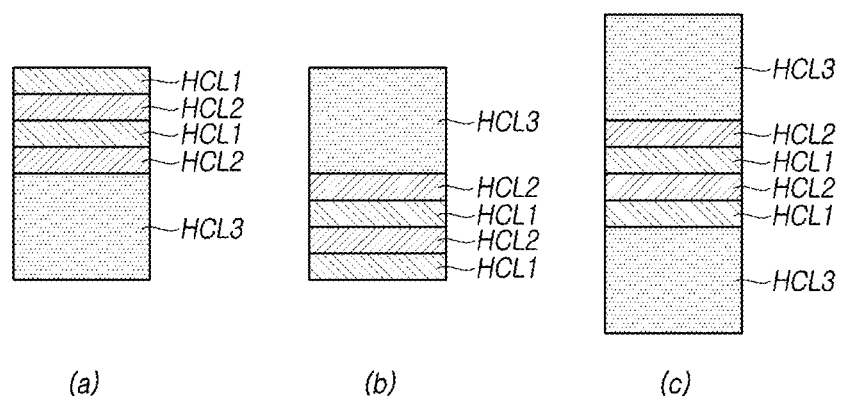
FIG. 5 is a cross-sectional view illustrating a hydrogen trapping layer according to embodiments of the present disclosure.

FIG. 5 is a cross-sectional view illustrating the hydrogen trapping layer according to embodiments of the present disclosure. With reference to FIG. 5, the hydrogen trapping layer may comprise two or more first layers HCL1 and two more second layer HCL2 such that one second layer HCL2 is located between two first layers HCL1, or the first layers HCL1 and the second layers HCL2 are alternately located.

The hydrogen trapping layer HCL comprises the first layer(s) HCL1 and the second layer(s) HCL2 as described above. It may therefore be possible to cause an interface area of a SiNx layer for trapping hydrogen to be widened, and the capability of the hydrogen trapping layer to trap hydrogen to be increased and possibly maximized. The way in which hydrogen is trapped on the interface of the SiNx layer will be described below.

Figure 6:
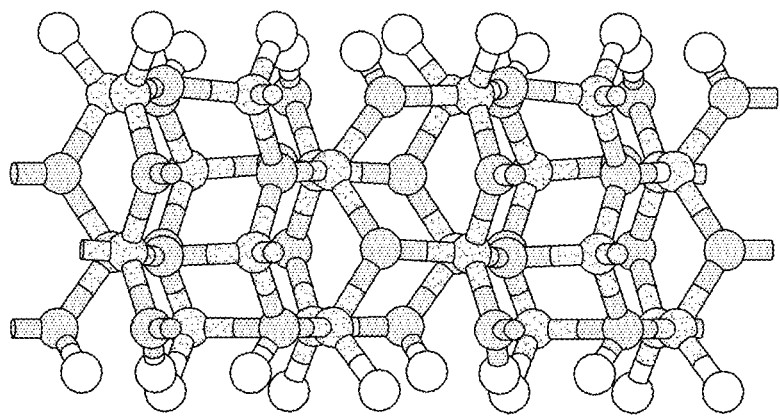
FIG. 6 is a diagram illustrating silicon nitride (SiNx) included in the hydrogen trapping layer according to embodiments of the present disclosure.

FIG. 6 is a diagram illustrating silicon nitride SiNx included in the hydrogen trapping layer according to embodiments of the present disclosure.

As described above, the first layer HCL1 may comprise the silicon nitride SiNx. With reference to FIG. 6, the silicon nitride SiNx may trap hydrogen at an upper portion and a lower portion of an atomic layer formed of SiNx. Accordingly, the hydrogen trapping layer HCL comprising the first layer HCL1 including silicon nitride SiNx may prevent hydrogen included in the encapsulation layer ENC from reaching the semiconductor layer SEM.

Because hydrogen is trapped on the interface of the SiNx as illustrated in FIG. 6, when one or more first layers HCL1 and one or more second layers HCL2 are alternately located as illustrated in FIG. 5, it may be possible to increase and possibly maximize the capability of the hydrogen trapping layer to trap hydrogen, because hydrogen may be trapped on the interface of the SiNx included in the first layer HCL1.

Figure 7:
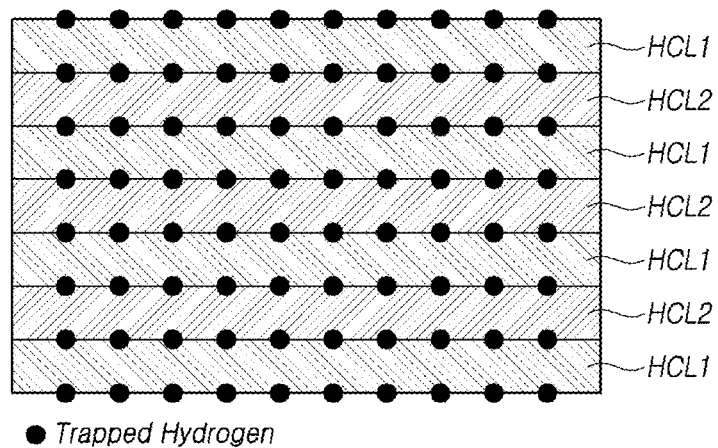
FIG. 7 illustrates hydrogen trapped in the hydrogen trapping layer according to embodiments of the present disclosure.

FIG. 7 illustrates that hydrogen is trapped in the hydrogen trapping layer according to embodiments of the present disclosure. With reference to FIG. 7, it may be seen that one or more first layers HCL1 and one or more second layers HCL2 are alternately located, and hydrogen is trapped on the interface of the one or more first layers HCL1. Accordingly, when the first layer(s) HCL1 and the second layer(s) HCL2 are alternately located, the capability of the hydrogen trapping layer to trap hydrogen may be increased and possibly maximized.

Further, because the first layer HCL1 and the second layer HCL2 are formed by MOCVD or ALD capable of forming a film with a thin thickness as illustrated in FIG. 5, it may be possible to increase and possibly maximize the capability of the hydrogen trapping layer to trap hydrogen by increasing the number of alternate first and second layers in a panel, a transistor and an electronic device that require an equivalent level of thinness, and as a result, cause an SiNx interface area to be increased.

With reference to FIG. 5, the hydrogen trapping layer HCL may comprise an area in which one or more first layers HCL1 and one or more second layers HCL2 are alternately disposed, and comprise one or more third layers HCL3 disposed in at least one of an upper portion and a lower portion of the area in which one or more first layers HCL1 and one or more second layers HCL2 are alternately disposed.

FIG. 5(a) illustrates the hydrogen trapping layer including the third layer HCL3 disposed in the lower portion of the area in which one or more first layers HCL1 and one or more second layers HCL2 are alternately disposed.

FIG. 5(b) illustrates the hydrogen trapping layer including the third layer HCL3 disposed in the upper portion of the area in which one or more first layers HCL1 and one or more second layers HCL2 are alternately disposed.

FIG. 5(c) illustrates the hydrogen trapping layer including two third layers HCL3 disposed in the upper and lower portions of the area in which one or more first layers HCL1 and one or more second layers HCL2 are alternately disposed.

The first layer HCL1 and the second layer HCL2 may be formed by MOCVD or ALD available to form a film with a thin thickness, in order to increase and possibly maximize the capability of trapping hydrogen. However, as described above, it may be disadvantageous to have a slow process speed.

As described above, because the third layer HCL3 is not a film formed using MOCVD or ALD, the third layer HCL3 may be formed at a more rapid speed compared with the first layer HCL1 and the second layer HCL2. Accordingly, because the hydrogen trapping layer in accordance with embodiments of the present disclosure comprises the third layer HCL3 as illustrated in FIG. 5, the hydrogen trapping layer may not only have an excellent capability to trap hydrogen, but be formed by a rapid process.

FIGS. 8 to 11 are cross-sectional views illustrating the panel according to embodiments of the present disclosure.

FIGS. 8 to 11 illustrate examples of the structure of the panel, but embodiments of the present disclosure are not limited thereto. It should be noted that in some embodiments, one or more elements shown in FIGS. 8 to 11 may be omitted, repeated, and/or performed in a different stack or location from the stacks or locations shown in FIGS. 8 to 11; therefore, the scope of the disclosure should not be considered limited to the specific arrangements shown in FIGS. 8 to 11.

Figure 8:
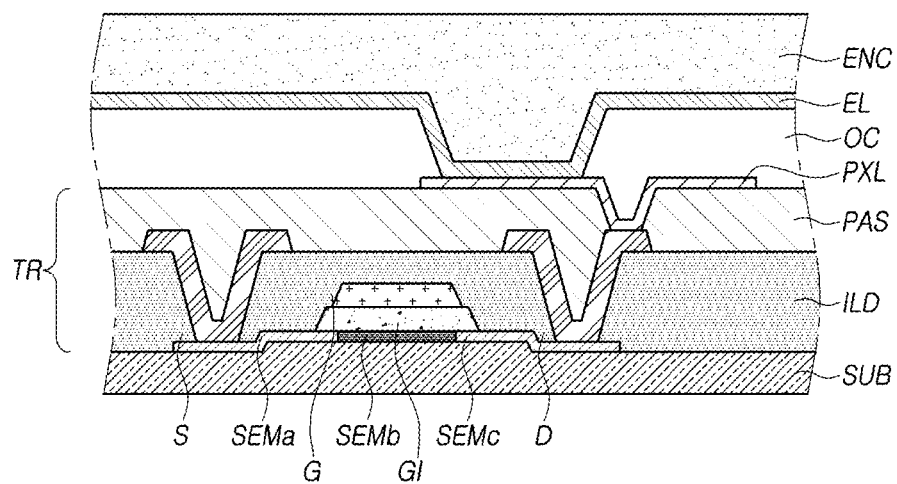
FIGS. 8 to 11 are cross-sectional views illustrating the panel according to embodiments of the present disclosure.

With reference to FIG. 8, the panel in accordance with embodiments of the present disclosure may comprise at least one transistor TR. The transistor TR may comprise a substrate SUB, a semiconductor layer (SEMa, SEMb, and SEMc), a gate insulating layer GI, a gate electrode G, an interlayer insulating film ILD, a source electrode S, a drain electrode D, and a passivation layer PAS.

The semiconductor layer (SEMa, SEMb, and SEMc) is the same as the semiconductor layer SEM of the panel described above, the details of which are not repeated here for brevity.

The gate insulating layer GI may be disposed on the semiconductor layer (SEMa, SEMb, and SEMc), and the gate electrode G may be disposed on the gate insulating layer GI.

The interlayer insulating film ILD may be disposed on the gate electrode G and the semiconductor layer (SEMa, SEMb, and SEMc). For example, the interlayer insulating film ILD may be disposed to cover all or part of each of the semiconductor layers (SEMa, SEMb, and SEMc) disposed on the substrate SUB, the gate insulating layer GI disposed on the semiconductor layer (SEMa, SEMb, and SEMc), and the gate electrode G disposed on the gate insulating layer GI.

The source electrode S may be electrically connected to the semiconductor layer in an upper portion of one end SEMa of the semiconductor layer, and the drain electrode D may be electrically connected to the semiconductor layer in an upper portion of the other end SEMc of the semiconductor layer.

The passivation layer PAS may be disposed on the source electrode S, the drain electrode D, and the interlayer insulating film ILD, and the overcoat layer OC may be disposed on the passivation layer PAS. The light emitting layer EL may be disposed on the overcoat layer OC, and be electrically connected to the drain electrode D of the transistor TR by a pixel electrode PXL.

At least one of the interlayer insulating film ILD and the passivation layer PAS may be the hydrogen trapping layer. The hydrogen trapping layer is not shown in FIG. 8. A location of the hydrogen trapping layer will be discussed with reference to FIGS. 9 to 11.

As described above, the hydrogen trapping layer may be a layer that prevents the characteristics of the semiconductor layer from being degraded due to hydrogen included in the encapsulation layer reaching the semiconductor layer.

Figure 9:
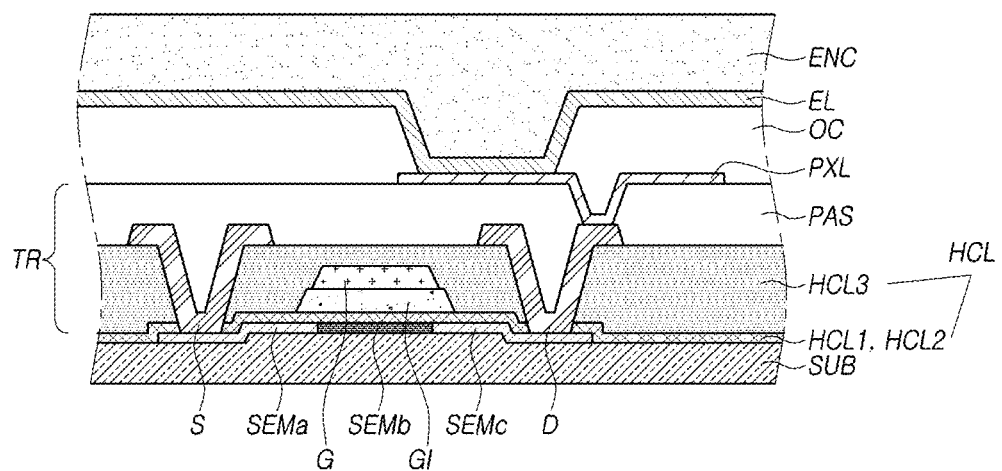

FIG. 9 is a cross-sectional view illustrating a panel including the hydrogen trapping layer as the interlayer insulating film according to embodiments of the present disclosure. To facilitate understanding, the hydrogen trapping layer is represented by the label HCL in FIG. 9, but the hydrogen trapping layer HCL functions as the interlayer insulating film ILD. For example, the third layer HCL3 of the hydrogen trapping layer HCL may be a layer functioning as the interlayer insulating film ILD.

The hydrogen trapping layer HCL in FIG. 9 may comprise one or more first layers HCL1 and one or more second layers HCL2, which are alternately disposed, and one third layer HCL3 located on the upper portion, such as the top surface, of an area in which the one or more first layers HCL1 and the one or more second layers HCL2 are alternately disposed (as shown in FIG. 5(b)). Although the hydrogen trapping layer HCL in FIG. 9 is depicted based on the hydrogen trapping layer shown in FIG. 5(b) for convenience of description and ease of understanding, the hydrogen trapping layer HCL in accordance with embodiments of the present disclosure may comprise the hydrogen trapping layers shown in FIGS. 5(a) and 5(a). The scope of the disclosure should not be considered limited to the specific arrangement of the hydrogen trapping layer HCL in FIG. 5(b).

As shown in FIG. 9, when the hydrogen trapping layer HCL is used as the interlayer insulating film, the hydrogen trapping layer HCL may prevent characteristics of one or more elements of the semiconductor layer from being degraded due to hydrogen of the encapsulation layer ENC reaching the semiconductor layer SEM.

In the panel shown in FIG. 9, as described above, for example, the first layer HCL1 and the second layer HCL may be formed by MOCVD or ALD, and the third layer HCL3 may be formed by sputtering or PECVD.

Figure 10:
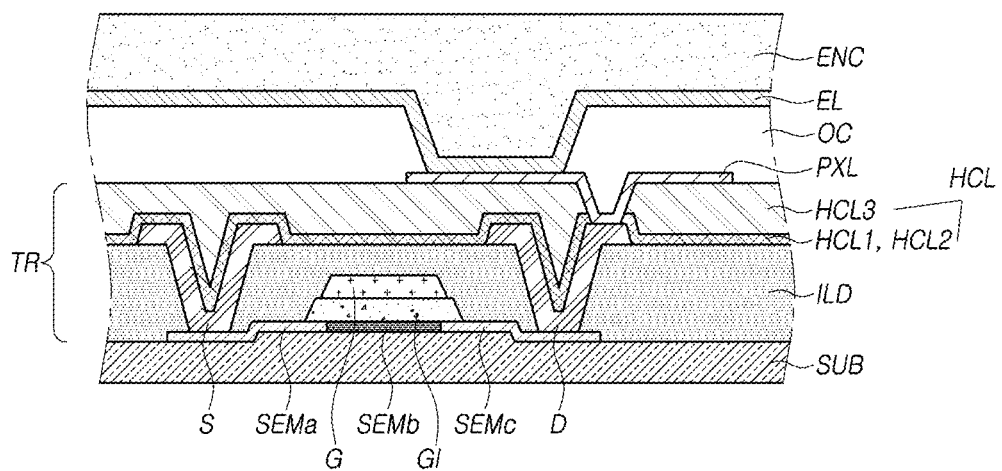

FIG. 10 is a cross-sectional view illustrating the panel including the hydrogen trapping layer as the passivation layer according to embodiments of the present disclosure. To facilitate understanding, the hydrogen trapping layer is represented by the label HCL in FIG. 10, but the hydrogen trapping layer HCL functions as the passivation layer PAS. For example, the third layer HCL3 of the hydrogen trapping layer HCL may be a layer functioning as the passivation layer PAS.

The hydrogen trapping layer HCL in FIG. 10 may comprise one or more first layers HCL1 and one or more second layers HCL2, which are alternately disposed, and one third layer HCL3 located on the upper portion, such as the top surface, of an area in which the one or more first layers HCL1 and the one or more second layers HCL2 are alternately disposed (as shown in FIG. 5(b)). Although the hydrogen trapping layer HCL in FIG. 10 is depicted based on the hydrogen trapping layer shown in FIG. 5(b) for convenience of description and ease of understanding, the hydrogen trapping layer HCL in accordance with embodiments of the present disclosure may comprise the hydrogen trapping layers shown in FIGS. 5(a) and 5(c). The scope of the disclosure should not be considered limited to the specific arrangement of the hydrogen trapping layer HCL in FIG. 5(b).

As shown in FIG. 10, when the hydrogen trapping layer HCL is used as the passivation layer, the hydrogen trapping layer HCL may prevent characteristics of one or more elements of the semiconductor layer from being degraded due to hydrogen of the encapsulation layer ENC reaching the semiconductor layer SEM.

Figure 11:
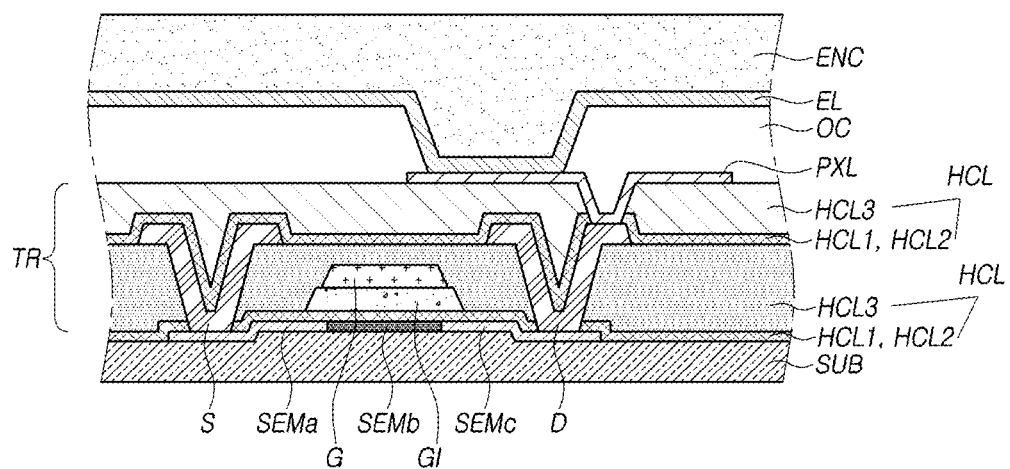

FIG. 11 is a cross-sectional view illustrating the panel including the hydrogen trapping layer as the interlayer insulating film and the passivation layer according to embodiments of the present disclosure. To facilitate understanding, the hydrogen trapping layer is represented by the label HCL in FIG. 11, but the hydrogen trapping layer HCL functions as the interlayer insulating film ILD and/or the passivation layer PAS. For example, the third layer HCL3 of the hydrogen trapping layer HCL may be a layer functioning as the interlayer insulating film ILD or the passivation layer PAS.

The hydrogen trapping layer HCL in FIG. 11 may comprise one or more first layers HCL1 and one or more second layers HCL2, which are alternately disposed, and one third layer HCL3 located on the upper portion, such as the top surface, of an area in which the one or more first layers HCL1 and the one or more second layers HCL2 are alternately disposed (as shown in FIG. 5(b)). Although the hydrogen trapping layer HCL in FIG. 11 is depicted based on the hydrogen trapping layer shown in FIG. 5(b) for convenience of description and ease of understanding, the hydrogen trapping layer HCL in accordance with embodiments of the present disclosure may comprise the hydrogen trapping layers shown in FIGS. 5(a) and 5(c). The scope of the disclosure should not be considered limited to the specific arrangement of the hydrogen trapping layer HCL in FIG. 5(B).

As described above, the hydrogen trapping layer may also be the overcoat layer OC. Therefore, when the hydrogen trapping layer is the overcoat layer OC, it may be possible to prevent the semiconductor layer (SEMa, SEMb, and SEMc) from being degraded by hydrogen included in the encapsulation layer ENC, in a similar manner as the above-described embodiments in which the hydrogen trapping layer is used as the interlayer insulating film ILD and/or the passivation layer PAS.

Figure 12:
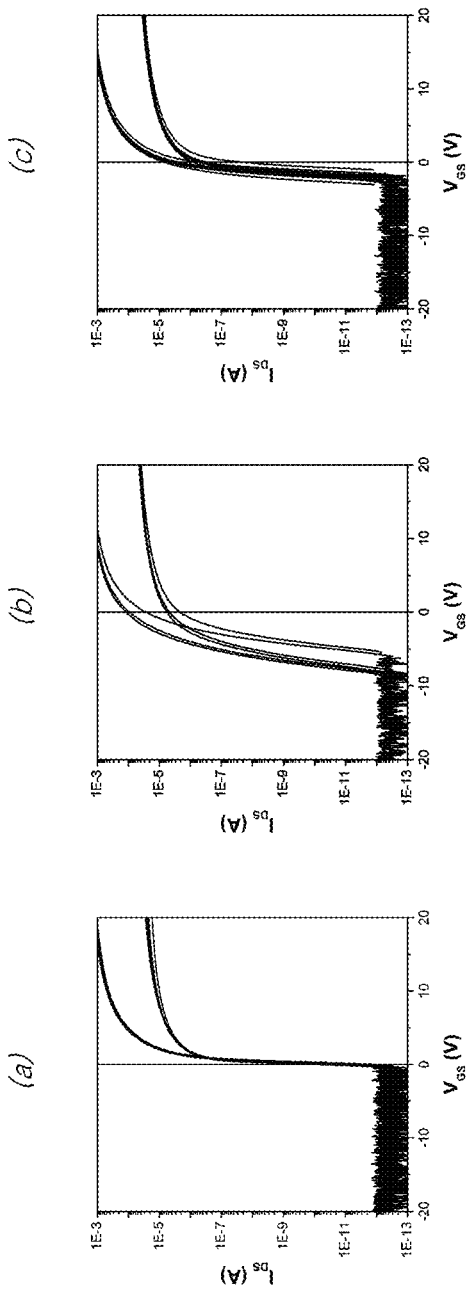
FIG. 12 illustrates data representing characteristics of threshold voltages in the panel according to embodiments of the present disclosure.

FIG. 12 illustrates data representing characteristics of threshold voltages in the panel according to embodiments of the present disclosure.

FIGS. 12(a) and 12(b) represent measurements of characteristics of threshold voltages in the panel not comprising the hydrogen trapping layer as shown in FIG. 8. FIG. 12(a) represents characteristics of threshold voltages measured before the encapsulation layer ENC is formed but after the light emitting layer EL of the panel shown in FIG. 8 has been formed. FIG. 12(n) represents characteristics of threshold voltages measured after the encapsulation layer ENC of the panel shown in FIG. 8 has been formed. FIG. 12(c) represents characteristics of threshold voltages measured after the encapsulation layer ENC of the panel shown in FIG. 10 has been formed.

With reference to FIG. 12(a), before the encapsulation layer ENC including hydrogen is formed, the degradation of the semiconductor layer does not occur. Therefore, it may be seen that characteristics of threshold voltages are normally exhibited. With reference to FIG. 12(b), after the encapsulation layer ENC including hydrogen has been formed, the degradation of the semiconductor layer by the hydrogen occurs; therefore, it may be seen that characteristics of threshold voltages are reduced.

For example, it may be seen that a negative shift of threshold voltages VGS has occurred in data in FIG. 12(b) compared with FIG. 12(a). It may be presumed that such a phenomenon is because hydrogen included in the encapsulation layer ENC formed by the PECVD has caused physical properties of the light emitting layer EL to be degraded.

FIG. 12(c) represents characteristics of threshold voltages of the transistor measured when the passivation layer PAS is the hydrogen trapping layer HCL, as shown in FIG. 10. With reference to FIG. 12(c), compared with FIG. 12(a), it may be seen that because the encapsulation layer ENC including hydrogen has been formed, the degradation of characteristics of threshold voltages has occurred to some extent.

However, it may be seen that a negative shift of threshold voltages VGS has occurred to a lesser extent than that of FIG. 12(a), in which the hydrogen trapping layer is not formed. Accordingly, in accordance with embodiments of the present disclosure, it may be possible for the hydrogen trapping layer HCL to prevent a characteristic of a threshold voltage of a transistor from being degraded due to hydrogen of the encapsulation layer ENC reaching the semiconductor layer.

In addition, the transistor TR may be provided that comprises a substrate SUB, a semiconductor layer (SEMa, SEMb, and SEMc), a gate insulating layer GI, a gate electrode G, an interlayer insulating film ILD, a source electrode S, a drain electrode D, and a passivation layer PAS.

This semiconductor layer (SEMa, SEMb, and SEMc) of the transistor may be the same as the semiconductor layer of the panel described above, the details of which are not repeated here for brevity. The gate insulating layer GI may be disposed on the semiconductor layer SEMb, and the gate electrode G may be disposed on the gate insulating layer GI.

The interlayer insulating film ILD may be disposed on the gate electrode G and the semiconductor layer (SEMa, SEMb, and SEMc). The source electrode S may be electrically connected to the semiconductor layer in an upper portion of one end SEMa of the semiconductor layer, and the drain electrode D may be electrically connected to the semiconductor layer in an upper portion of the other end SEMc of the semiconductor layer.

The passivation layer PAS may be disposed on the source electrode S, the drain electrode D, and the interlayer insulating film ILD. At least one of the interlayer insulating film ILD and the passivation layer PAS may be the hydrogen trapping layer.

The hydrogen trapping layer of the transistor may be the same as that of the panel described above, the details of which are not repeated here for brevity.

Although example embodiments of the present disclosure has been described for illustrative purposes, those skilled in the art will appreciate that various modifications, additions and substitutions are possible, without departing from the scope and spirit of the disclosure as disclosed in the accompanying claims. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The various embodiments described above may be combined to provide further embodiments. These and other changes may be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

It will be apparent to those skilled in the art that various modifications and variations can be made in the panel, transistor and electronic device of the present disclosure without departing from the spirit or scope of the disclosure. Thus, it is intended that the present disclosure cover the modifications and variations of this disclosure provided they come within the scope of the appended claims and their equivalents.

What is claimed is:

1. A panel, comprising:
   a substrate;
   a semiconductor layer on the substrate, and including an oxide semiconductor or a low-temperature polycrystalline silicon;
   an interlayer insulating film on the substrate and the semiconductor layer;
   a passivation layer on the interlayer insulating film;
   an overcoat layer on the passivation layer;
   a light emitting layer on the overcoat layer; and
   an encapsulation layer on the light emitting layer,
   wherein the encapsulation layer includes an auxiliary encapsulation layer having at least one of a silicon nitride (SiNx:H) layer including hydrogen, a silicon oxide (SiO$_2$:H) layer including hydrogen, or a silicon oxynitride (SiON:H) layer including hydrogen,
   wherein at least one of the interlayer insulating film, the passivation layer, or the overcoat layer is a hydrogen trapping layer,
   wherein the hydrogen trapping layer includes a first layer having silicon nitride (SiNx), a second layer having a different composition from the first layer and contacting one surface of the first layer, and a third layer having a greater thickness than each of the first and second layers, and
   wherein a ratio A:B of a thickness 'A' of the first layer to an entire thickness 'B' of the hydrogen trapping layer is 1:2000 to 1:20, and a ratio C:B of a thickness 'C' of the second layer to the entire thickness 'B' of the hydrogen trapping layer is 1:2000 to 1:20.

2. The panel according to claim 1, wherein the hydrogen trapping layer comprises at least two first layers, and the second layer is disposed between the at least two first layers.

3. The panel according to claim 1, wherein the hydrogen trapping layer comprises an area in which the first layer and the second layer are alternately disposed, and one or more third layers is disposed on at least one of an upper portion and a lower portion of the area in which the first layer and the second layer are alternately disposed.

4. The panel according to claim 1, wherein the second layer comprises silicon oxide (SiO$_2$).

5. The panel according to claim 1, wherein the first layer has a greater thickness uniformity than the auxiliary encapsulation layer.

6. The panel according to claim 1, wherein the second layer has a greater thickness uniformity than the at least one auxiliary encapsulation layer.

7. The panel according to claim 1, wherein the first layer has a greater thickness uniformity than the third layer.

8. The panel according to claim 1, wherein the second layer has a greater thickness uniformity than the third layer.

9. An electronic device, comprising:
   a panel according to claim 1; and
   a driving circuit configured to drive the panel.

10. A transistor on a substrate, comprising:
    a semiconductor layer on the substrate, and including an oxide semiconductor or a low-temperature polycrystalline silicon;
    a gate insulating layer on the semiconductor layer;
    a gate electrode on the gate insulating layer;
    an interlayer insulating film on the gate electrode and the semiconductor layer;
    a source electrode electrically connected to the semiconductor layer in an upper portion of one end of the semiconductor layer;
    a drain electrode electrically connected to the semiconductor layer in an upper portion of the other end of the semiconductor layer; and
    a passivation layer on the source electrode, the drain electrode, and the interlayer insulating film,
    wherein at least one of the interlayer insulating film or the passivation layer is a hydrogen trapping layer,
    wherein the hydrogen trapping layer includes:
       a first layer having silicon nitride (SiNx), a second layer having a different composition from the first layer and contacting one surface of the first layer, and a third layer having a greater thickness than each of the first and second layers,
       wherein a ratio A:B of a thickness 'A' of the first layer to an entire thickness 'B' of the hydrogen trapping layer is 1:2000 to 1:20, and a ratio C:B of a thickness 'C' of the second layer to the entire thickness 'B' of the hydrogen trapping layer is 1:2000 to 1:20.

11. A display panel, comprising:
    a substrate;
    a semiconductor layer on the substrate;

an interlayer insulating film on the substrate and the semiconductor layer;
a passivation layer on the interlayer insulating;
an overcoat layer on the passivation layer;
a light emitting layer on the overcoat layer; and
an encapsulation layer on the light emitting layer,
wherein the encapsulation layer includes at least one of a silicon nitride (SiNx:H) layer including hydrogen, a silicon oxide ($SiO_2$:H) layer including hydrogen, or a silicon oxynitride (SiON:H) layer including hydrogen,
wherein at least one of the interlayer insulating film, the passivation layer, or the overcoat layer includes a first layer having silicon nitride (SiNx), a second layer having a different composition from the first layer and contacting the first layer, and a third layer having a greater thickness than each of the first and second layers.

* * * * *